United States Patent
Ito et al.

(10) Patent No.: US 6,724,213 B2
(45) Date of Patent: Apr. 20, 2004

(54) TEST BOARD FOR TESTING SEMICONDUCTOR DEVICE

(75) Inventors: Daisuke Ito, Nagano (JP); Hiroshi Nakagawa, Nagano (JP); Katsutoshi Ito, Nagano (JP); Naoyuki Shinonaga, Nagano (JP); Shinji Senba, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/284,284

(22) Filed: Oct. 31, 2002

(65) Prior Publication Data

US 2003/0197524 A1 Oct. 23, 2003

(30) Foreign Application Priority Data

Apr. 18, 2002 (JP) ........................................ 2002-116336

(51) Int. Cl.[7] ............................................... G01R 31/26

(52) U.S. Cl. ................................................... 324/765

(58) Field of Search ............................... 324/754, 755, 324/757, 758, 765, 158.1

(56) References Cited

U.S. PATENT DOCUMENTS

| | | | | |
|---|---|---|---|---|
| 5,896,037 A | * | 4/1999 | Kudla et al. | 324/755 |
| 6,069,482 A | * | 5/2000 | Hilton | 324/755 |
| 6,078,186 A | * | 6/2000 | Hembree et al. | 324/755 |
| 6,104,202 A | * | 8/2000 | Slocum et al. | 324/758 |
| 6,356,098 B1 | * | 3/2002 | Akram et al. | 324/765 |

FOREIGN PATENT DOCUMENTS

JP    8-201476    8/1996

* cited by examiner

*Primary Examiner*—Evan Pert
*Assistant Examiner*—Tung X. Nguyen
(74) *Attorney, Agent, or Firm*—McDermott, Will & Emery

(57) ABSTRACT

There is provided a test board for testing semiconductor devices by connecting a plurality of DUTs (semiconductor devices under the test) with a test head, and transmitting test signals from the test head to the plurality of DUTs. The test board comprises a motherboard connected to the test head; a multi-layer wiring board connected to each of the plurality of DUTs; and a scramble board disposed between the motherboard and the multi-layer wiring board. The motherboard and the scramble board, and the multi-layer wiring board and the scramble board are each connected by female connectors and male connectors.

5 Claims, 5 Drawing Sheets

TEST BOARD FOR TESTING SEMICONDUCTOR DEVICE

BACKGROUND OF THE INVENTION

1. Field of the Invention

The present invention relates to a test board for testing semiconductor devices by connecting a semiconductor testing apparatus and a semiconductor device in the test.

2. Background Art

A structure of a conventional multi-layer wiring board test jig/tool is shown in FIG. 9. In the multi-layer wiring board test jig/tool, output signals from the pogo pin of the test head 105 of the tester (semiconductor testing apparatus) are inputted to DUTs (devices under test) 120 through a multi-layer wiring board (mother board) 104, a relaying multi-layer wiring board (I/F board) 103, and contact sockets 102. The relaying multi-layer wiring board 103 and the contact sockets 102 correspond to the package form of the DUTs 120 and the pin locations of the DUTs 120, and they are connected with cable wirings. The test signals are transmitted from the test head 105 to a DUT 120 on a line tray 101, and the predetermined test is conducted.

However, the capacity of the tester limits the number of DUTs 120 that can be tested at a time, and the type of the DUT varies the number. Therefore, the specifications of the multi-layer wiring board test jig/tool becomes different depending on parameters such as the package form of the DUTs 120, the pin locations of the DUTs 120, and the conveying pattern of the DUTs 120.

In order to accommodate such various tests, in a conventional multi-layer wiring board test jig/tool as shown in FIG. 9, wiring using coaxial cables 106 was unavoidable in the connection of the multi-layer wiring board 104 with the relaying multi-layer wiring board (I/F board) 103 due to the structure of such a test jig/tool. Wiring was changed using the coaxial cables 106 corresponding to the specifications of DUTs 120. In this case, several tens of coaxial cables 106 were required for one DUT 120 (IC), and for example, when 30 DUTs 120 were to be tested at a time, wiring using coaxial cables 106 became very complicated, and there arose the problems of the complication of the wire-connecting process and the deterioration of wiring reliability and electrical properties.

Also in conventional testing methods, since a single IC as a DUT 120 had to be placed on a line tray 101, a problem of the deterioration of measurement efficiency and the complication of the testing process arose. Furthermore, the operation to transfer the IC on the line tray 101 to another tray was required.

SUMMARY OF THE INVENTION

The present invention was devised to solve the above-described problems, and the object of the present invention is to provide improved reliability of the connection between the DUT and the tester, and improved electrical properties, as well as the simplified test process and the improved measurement efficiency.

According to one aspect of the present invention, a test board for testing semiconductor devices by connecting a plurality of semiconductor devices under the test with a semiconductor test apparatus is provided. The test board sends test signals from the semiconductor test apparatus to the plurality of semiconductor devices under the test. The test board comprises a first wiring board, a second wiring board, and a third wiring board. The first wiring board is disposed on the semiconductor test apparatus, and connected to the semiconductor test apparatus. The second wiring board is connected to each of the plurality of semiconductor devices under the test through contact portions. The third wiring board is disposed between the first wiring board and the second wiring board. The first wiring board and the third wiring board, and the second wiring board and the third wiring board are each connected by connectors.

Since connections between the first wiring board and the third wiring board, and between the second wiring board and the third wiring board, are carried out by connectors, the connection between each wiring boards can be made wiring-less, and no wiring materials, such as coaxial cables, are required. Therefore, erroneous connections in assembling can be eliminated, and complicated wiring connection processes become unnecessary. Since the degradation of wiring materials caused by change thereof due to aging can be prevented, and high reliability can be maintained.

Other and further objects, features and advantages of the invention will appear more fully from the following description.

DETAILED DESCRIPTION OF THE PREFERRED EMBODIMENTS

First Embodiment

Figure 1:
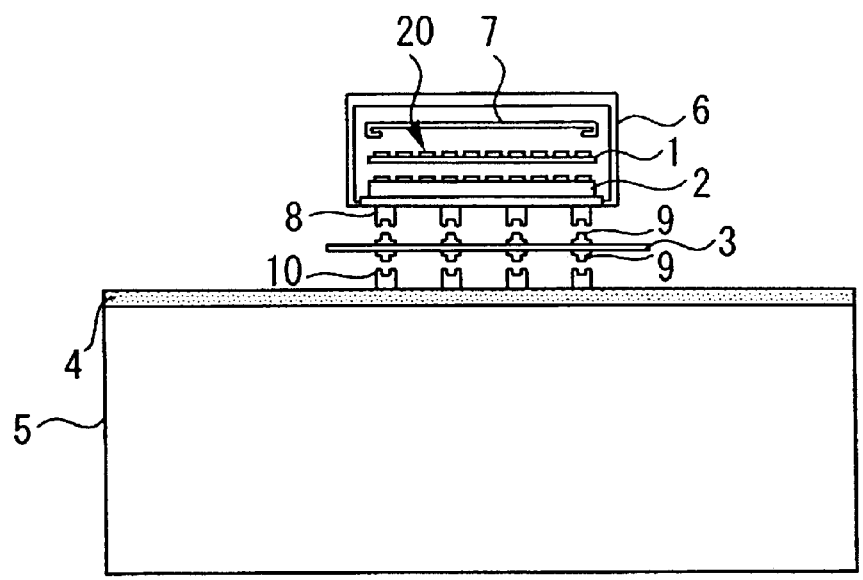
FIG. 1 is a schematic sectional view showing a structure of a multi-layer wiring board test jig/tool (test board for semiconductor testing) according to First Embodiment of the present invention.

FIG. 1 is a schematic sectional view showing a structure of a multi-layer wiring board test jig/tool (test board for semiconductor testing) according to First Embodiment of the present invention. This multi-layer wiring board test jig/tool is disposed on the test head 5 of the tester (semiconductor testing apparatus), and connects the tester pins of the test head 5 electrically to DUTs 20.

As FIG. 1 shows, the test jig/tool is disposed on the upper portion of the test head 5, and is composed of a multi-layer wiring board 4 (mother board 4) having female connectors, a multi-layer wiring board 3 (scramble board 3) having male connectors 9 on both front and back surfaces thereof, and a multi-layer wiring board 2 relaying between DUTs 20 and the scramble board 3. The test jig/tool is composed of these multi-layer wiring boards which are stacked on the test head 5. The multi-layer wiring board 2 is composed of a lower I/F board and an upper frame contact portion; and female connectors 8 are mounted on the bottom surface of the I/F board.

In First Embodiment, DUTs 20 subjected to the test are ICs (semiconductor chips) placed on the lead frame 1. By testing the ICs before separating each ICs on the lead frame 1 individually, the test process can be continued after encapsulating ICs on the lead frame 1 with a resin, and the manufacturing process can be simplified.

ICs, which are DUTs 20, are disposed in a chamber 6 in the state held by the lead frame 1. A frame-conveying tray 7 for conveying the lead frame 1 is provided in the chamber 6.

The frame contact portion of the multi-layer wiring board 2 is electrically connected to DUTs 20 on the lead frame 1 in the chamber 6, and thereby the test is conducted at a predetermined temperature. The scramble board 3 is specially designed and fabricated to meet the specifications of the DUTs 20.

In this test jig/tool, the motherboard 4 is connected to the scramble board 3 using female connectors 10 and male connectors 9. The scramble board 3 is also connected to the multi-layer wiring board 2 using male connectors 9 and female connectors 8. In First Embodiment, for example, zero-insertion-force connectors (ZIFs) can be used as female connectors 8 and 10, and male connectors 9. Using these connectors, connection between multi-layer boards can be performed using no wiring, and no wiring materials, such as coaxial cables, are required in electrical connection of signal lines from the tester pins of the test head 5 to DUTs 20. Therefore, compared with conventional wiring using coaxial cables, erroneous wire connection in assembling can be minimized. Also, the degradation of wiring caused by change of wiring due to aging can be prevented, and high reliability can be maintained.

According to Example 1, as described above, since the multi-layer wiring board 2 is connected to the scramble board 3 using female connectors 8 and male connectors 9, and the multi-layer wiring board 4 is connected to the scramble board 3 using female connectors 10 and male connectors 9, connection between multi-layer wiring boards can be made in a wiring-less structure, and the electrical connection from the test head 5 to DUTs 20 can be performed without using wiring materials, such as coaxial cables. Therefore, erroneous wire connection in assembling can be minimized, and complicated wire-connecting process can be eliminated. Also, since the degradation of wiring caused by change of wiring due to aging can be prevented, high reliability can be maintained.

Second Embodiment

Next, Second Embodiment of the present invention will be described below referring to the drawings. Second Embodiment enables the test of the largest number of DUTs 20 that can be measured simultaneously determined from the capacity of a tester. In Second Embodiment, a multi-layer wiring board test jig/tool of First Embodiment is used.

Figure 2:
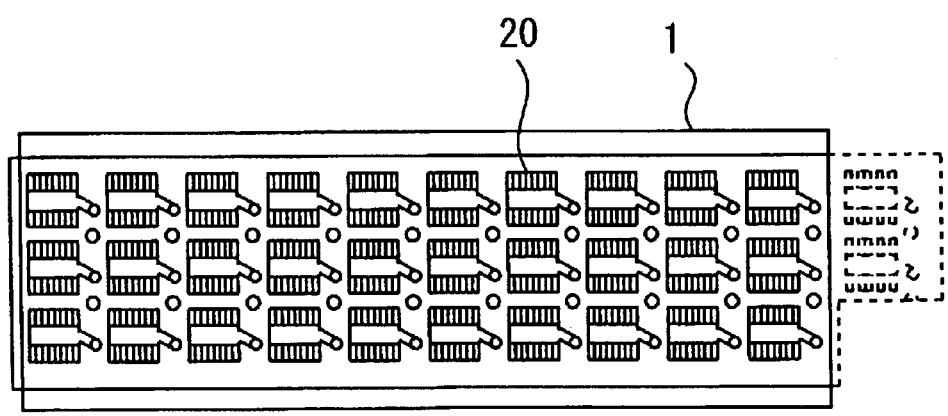
FIG. 2 is a plan view showing the case where the largest number that can be measured simultaneously by the tester does not match the number of ICs on the lead frame.

FIG. 2 shows the case where the largest number that can be measured simultaneously by the tester does not match the number of ICs on the lead frame 1, when the ICs on the lead frame 1 are tested without separating. Here, the number of ICs carried by the lead frame 1 is: 3 (rows)×10 (columns)= 30.

On the other hand, although the largest number of ICs that can be measured simultaneously determined from the capacity of a tester depends on the specifications of the ICs, it is normally 4, 8, 16, or 32. Therefore, as FIG. 2 shows, even though two more ICs can be measured by the intrinsic capacity of the tester, the number of ICs measured when one lead frame 1 is measured is 30, and the largest number of simultaneous measurement of the tester cannot be tested.

In particular, since the number of ICs that can be disposed on a lead frame 1 is restricted form the specifications of ICs, semiconductor manufacturing equipment, and different testing apparatus, it is inevitably determined from these factors. Therefore, it is difficult to match the largest number of simultaneous measurement of the tester with the number of ICs on the lead frame 1 neither too many nor too few.

In Second Embodiment, a plurality of lead frames 1 are connected to extend to a lengthwise direction, and the lead frames 1 are conveyed in the chamber 6 in every test for testing the largest number of ICs that can be measured simultaneously by the tester from the end of the lead frames 1.

Figure 3:
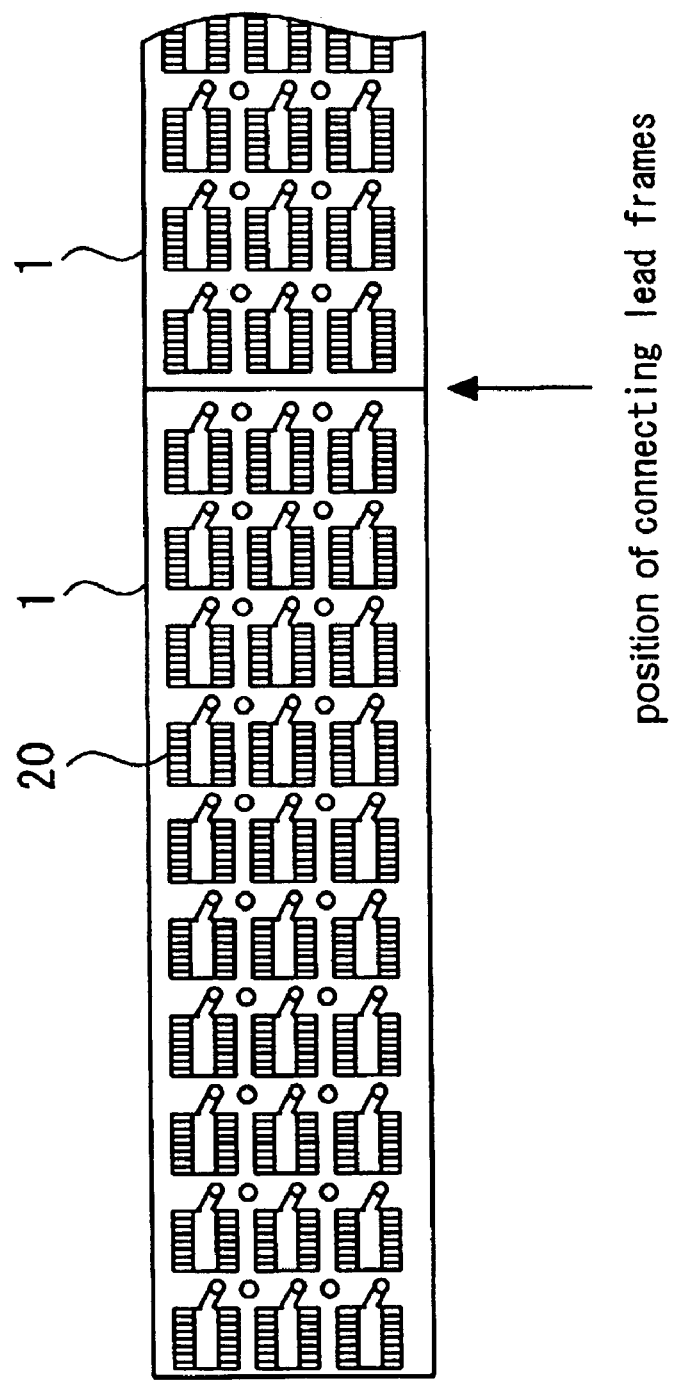
FIG. 3 is a plan view showing the state where lead frames have been connected.

FIG. 3 is a plan view showing the state where lead frames 1 have been connected. As FIG. 3 shows a plurality of lead frames 1 are contacted to each other, and conveyed with a frame-conveying tray 7 in the chamber 6 sequentially to test the largest number of ICs that can be measured simultaneously of the tester.

Here, for example, the case where the largest number of ICs that can be measured simultaneously of the tester is 32 will be described. Even in the case where lead frames are connected, if 10 columns of ICs are tested at a time, only 30 ICs can be tested at a time. Therefore, two ICs become short from the largest number of ICs that can be measured simultaneously of the tester of 32, and the efficiency of simultaneous measurement is lowered. In Second Embodiment, therefore, the separating position of the ICs on the connected lead frames 1 for one time of the test is changed to meet the largest number of ICs that can be measured simultaneously of the tester.

Figure 4:
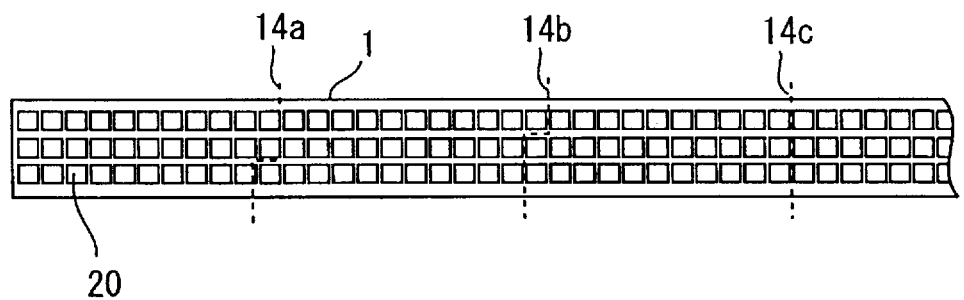
FIG. 4 is a plan view showing a position of separating ICs on the lead frames determined to meet the largest number of ICs that can be measured simultaneously of the tester.

FIG. 4 is a plan view showing a position of separating ICs on the lead frames 1 determined to meet the largest number of ICs that can be measured simultaneously of the tester. In FIG. 4, boundary lines 14*a*, 14*b*, and 14*c* show boundaries of dividing the arrayed lead frames 1 into areas each for the largest number of ICs that can be measured simultaneously of the tester. By thus connecting a plurality of lead frames 1 in line, and dividing them into areas each for 32 ICs, the largest number of ICs that can be measured simultaneously of the tester, the largest number of ICs that can be measured simultaneously can be tested by a single test.

Figure 5:
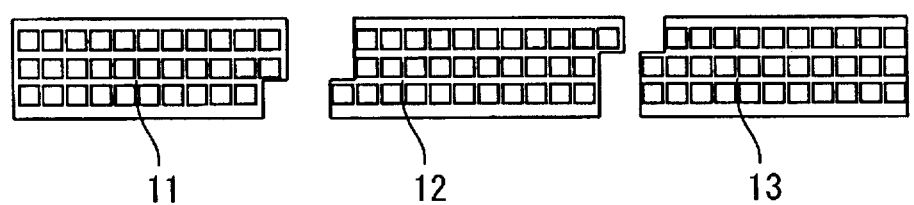
FIG. 5 is a schematic diagram showing the array patterns of 32 ICs divided by the boundary lines shown in FIG. 4.

FIG. 5 is a schematic diagram showing the array patterns of 32 ICs divided by the boundary lines 14*a*, 14*b*, and 14*c* shown in FIG. 4. When three columns of ICs are placed on the lead frames 1 in the major-side direction, there are three array patterns of 32 ICs divided by the boundary lines 14*a*, 14*b*, and 14*c*, for example, array pattern (A)11, array pattern (B)12, and array pattern (C)13.

Therefore, conveying the lead frames 1 while switching the test signals from the tester into three array patterns, and cyclically testing ICs in array pattern (A)11, array pattern (B)12, and array pattern (C)13, 32 ICs can be tested at every time.

The scramble board 3 has the function to switch array patterns. The scramble board 3 comprises all the wiring specifications (circuits) for array pattern (A)11, array pattern (B)12, and array pattern (C)13, and switches the wiring specifications corresponding to each array pattern for each test to transmit test signals from the tester to the multi-layer wiring board 2.

Thereby, the array patterns and the wiring from tester pins can be switched for each test so as to correspond to the three array patterns, and the test for 32 ICs, the largest number of ICs that can be measured simultaneously of the tester, can be conducted. Therefore, the number of ICs measured simultaneously can be increased, and the measuring efficiency can be improved.

Figure 9:
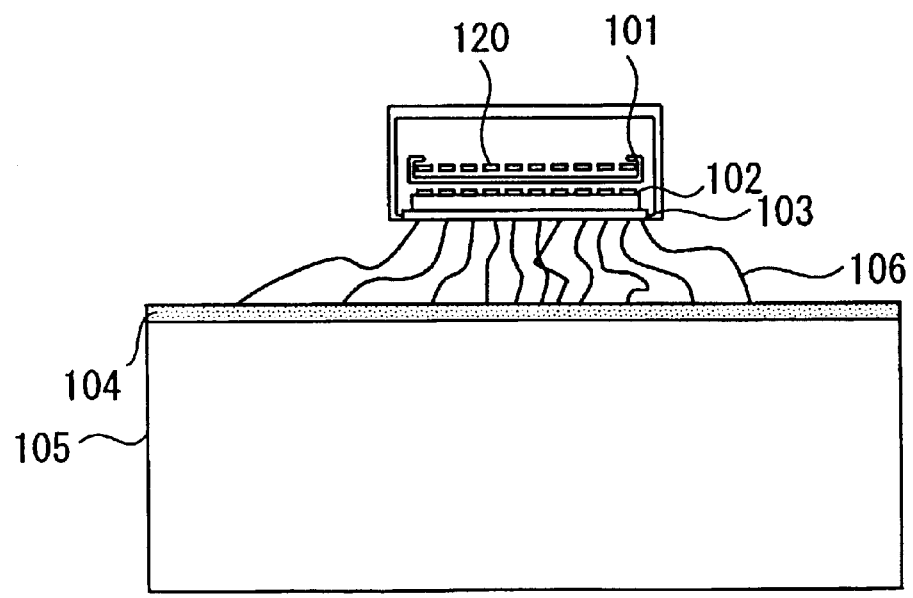
FIG. 9 is a schematic sectional view showing a structure of a conventional multi-layer wiring board test jig/tool.

When similar array patterns are switched using a conventional multi-layer wiring board test jig/tool connected with coaxial cables as shown in FIG. 9, since different wirings by coaxial cables must be used to the three array patterns, all the test jigs/tools corresponding to all wiring patterns must be fabricated. In Second Embodiment, since the scramble board 3 has the function to switch array patterns, the test can be conducted using one test jig/tool, minimizing the costs for the test, and facilitating the maintenance operations.

According to Second Embodiment, as described above, since the lead frames 1 are connected in the length direction, and the largest number of ICs that can be measured simultaneously of the tester are sequentially tested while the lead frames 1 is conveyed with the frame-conveying tray 7, the test for the largest number of ICs that can be measured simultaneously of the tester can be conducted without the restriction of the arrangement of ICs on the lead frames 1. In this time, even if the array pattern of ICs is different each time, the largest number of ICs that can be measured simultaneously of the tester can always be tested at a time by sequentially switching the array patterns using the scramble board 3. Therefore, the number of ICs that can be measured simultaneously can be increased, and the measuring efficiency can be improved significantly.

Third Embodiment

Next, Third Embodiment of the present invention will be described below referring to the drawings. In Third Embodiment, switching of array patterns in Second Embodiment is performed by switching the connection of the scramble board 3 with the multi-layer wiring board 2.

Figure 6:
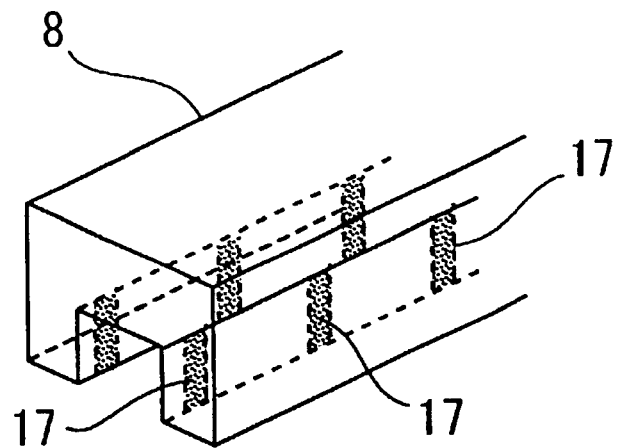
FIG. 6 is a schematic diagram showing a female connector mounted on the multi-layer wiring board.
Figure 7:
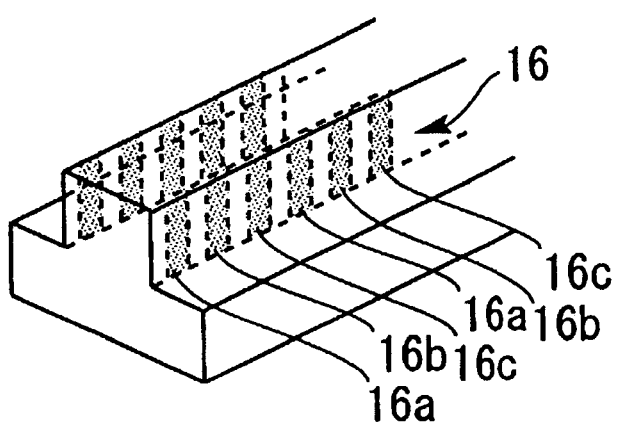
FIG. 7 is a schematic diagram showing a male connector mounted on the scramble board.

FIG. 6 is a schematic diagram showing a female connector 8 mounted on the multi-layer wiring board 2. FIG. 7 is a schematic diagram showing a male connector 9 mounted on the scramble board 3. As FIGS. 6 and 7 show, the female connector 8 has a linearly extending gutter, and the male connector 9 has a rib-like protrusion.

Referring to FIGS. 6 and 7, a method for switching the electrical connection of the scramble board 3 with the multi-layer wiring board 2 will be described below. As FIG. 7 shows, the male connector 9 has a plurality of connecting gold-plated portions 16. The connecting gold-plated portions 16 are arranged on the both sides of the rib-like protrusion of the male connector 9, and have three patterns, connecting gold-plated portions 16a, connecting gold-plated portions 16b, and connecting gold-plated portions 16c.

As described in Second Embodiment, the scramble board 3 comprises all the wiring specifications for array pattern (A) 11, array pattern (B)12, and array pattern (C)13. On the scramble board 3, the connecting gold-plated portions 16a are connected to wiring corresponding to the array pattern (A)11. Similarly, the connecting gold-plated portions 16b are connected to wiring corresponding to the array pattern (B)12, and the connecting gold-plated portions 16c are connected to wiring corresponding to the array pattern (C)13. As FIG. 7 shows, the connecting gold-plated portions 16a, 16b, and 16c are cyclically arranged on the protrusion of the male connector 9 in this order.

As FIG. 6 shows, the female connector 8 has connecting gold-plated portions 17, one for three connecting gold-plated portions 16a, 16b, and 16c of the male connector 9. The connecting gold-plated portions 17 arranged in the gutter of the female connector 8 in the pitch of the three connecting gold-plated portions 16a, 16b, and 16c.

Figure 8:
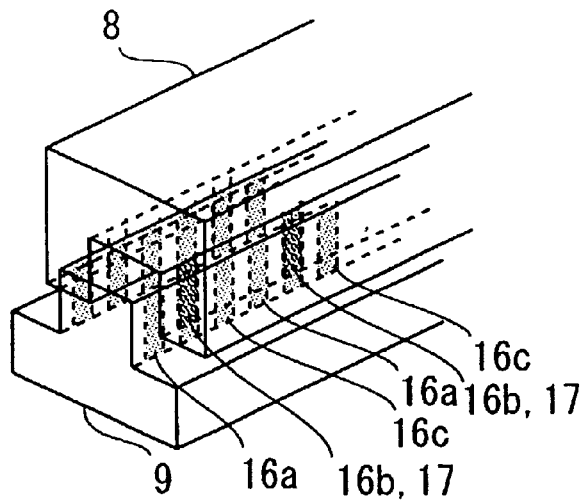
FIG. 8 is a schematic diagram showing the state where the female connector has been connected to the male connector.

FIG. 8 is a schematic diagram showing the state where the female connector 8 has been connected to the male connector 9. In the state where the female connector 8 is connected to the male connector 9 in the test, either one of the three connecting gold-plated portions 16a, 16b, and 16c is electrically connected with the connecting gold-plated portions 17.

Here, since the connecting gold-plated portions 16a correspond to the array pattern (A)11, when the connecting gold-plated portions 16a are connected to the connecting gold-plated portions 17, the test is conducted by the array pattern (A)11. Similarly, since the connecting gold-plated portions 16b correspond to the array pattern (B)12, and the connecting gold-plated portions 16c correspond to the array pattern (C)13, when the connecting gold-plated portions 16b are connected to the connecting gold-plated portions 17, the test is conducted by the array pattern (B)12, and when the connecting gold-plated portions 16c are connected to the connecting gold-plated portions 17, the test is conducted by the array pattern (C)13.

Switching of the array pattern (A)11, the array pattern (B)12, and the array pattern (C)13 is performed by switching the connections of the connecting gold-plated portions 17 to the connecting gold-plated portions 16a, 16b, and 16c. Since the gutter of the female connector 8 is fitted to the rib-like protrusion of the male connector 9, switching of connections can be performed by relatively moving the female connector 8 and the male connector 9 by the pitch of the connecting gold-plated portions 16a, 16b, and 16c.

In Third Embodiment, the connection of the scramble board 3 with the mother board 4 shown in FIG. 1 is also performed by fitting the rib-like protrusion of the male connector 9 of the scramble board 3 to the gutter of the female connector 10 of the motherboard 4. The extending direction of the ribs of male connectors 9 on the top and back surfaces of the scramble board 3 is the same. Therefore, only the scramble board 3 can be moved in the state where the multi-layer wiring board 2 and the motherboard 4 are fixed. In this time, since switching of the electrical connection of the male connector 9 of the scramble board 3 with the female connector 10 of the motherboard 4 is not required, the electrical connection state of the scramble board 3 and the motherboard 4 is not switched by the relative movement thereof.

Specifically, in the first test, the connecting gold-plated portions 17 are connected to the connecting gold-plated portions 16a, and the multi-layer wiring board 2 contacts the wiring of the scramble board 3 corresponding to the array pattern (A)11. In this time the test is conducted by the array pattern (A)11. In the second test, the scramble board 3 moves in the horizontal direction by a pitch of the connecting gold-plated portions 16, the connecting gold-plated portions 17 are connected to the connecting gold-plated portions 16b, and the multi-layer wiring board 2 contacts the wiring of the scramble board 3 corresponding to the array pattern (B)12. In this time the test is conducted by the array pattern (B)12. In the third test, the scramble board 3 further moves in the horizontal direction by a pitch of the connecting gold-plated portions 16, the connecting gold-plated portions 17 are connected to the connecting gold-plated portions 16c, and the multi-layer wiring board 2 contacts the wiring of the scramble board 3 corresponding to the array pattern (C)13. In this time the test is conducted by the array pattern (C)13. The scramble board 3 is automatically moved by mechanical control synchronizing the feed of the lead frames 1 by the frame-conveying tray 7.

By thus moving the scramble board 3 by one pitch of the connecting gold-plated portions 16 each time of measurement, the array pattern (A)11, the array pattern (B)12, and the array pattern (C)13 can be switched easily. Therefore, the rework of wiring connecting the multi-layer board 2 with the motherboard 4 for each array pattern becomes unnecessary, and the measuring efficiency can be improved significantly.

According to Third Embodiment, as described above, since the female connectors 8 and the male connectors 9 are slid to switch electrical connections, wirings for each array pattern provided on the scramble board 3 can be switched. Therefore, the array pattern (A)11, the array pattern (B)12, and the array pattern (C)13, the patterns of the largest number of ICs that can be measured simultaneously by the tester, can be switched instantaneously, and the measuring efficiency can be improved significantly.

Being constituted as described above, the present invention has the effects as described below.

Since connections between the first wiring board and the third wiring board, and between the second wiring board and the third wiring board, are carried out by connectors, the connection between each wiring boards can be made wiringless, and no wiring materials, such as coaxial cables, are required. Therefore, erroneous connections in assembling can be eliminated, and complicated wiring connection processes become unnecessary. Since the degradation of wiring materials caused by change thereof due to aging can be prevented, and high reliability can be maintained.

Since the test is conducted by connecting to a plurality of semiconductor devices under the test placed on lead frames, the test can be conducted sequentially after encapsulating ICs, the manufacturing process can be simplified.

Since lead frames are connected in the major-side direction, and test signals are transmitted synchronizing the conveyance of the lead frames, the largest number of ICs that can be measured simultaneously by the tester can be tested sequentially.

Since the third wiring board has a plurality of circuits corresponding to different array patterns, even if the array patterns of ICs differ each time of the test, the array patterns can be switched sequentially. Therefore, the largest number of ICs that can be measured simultaneously by the tester can be tested without being restricted by the arrangement of ICs on the lead frames. Thereby, the number of ICs that can be measured simultaneously can be increased, and the measuring efficiency can be improved significantly.

Since the connectors are constituted so that the third wiring board is slidable relative to the first and second wiring boards, and the connectors are provided with a plurality of wiring patterns that are switched corresponding to the slide position of the third wiring board, a plurality of circuits can be switched by switching the connections of wiring patterns of the connectors. Therefore, no rework of wiring for each wiring pattern becomes required, and the array patterns of the largest number of ICs that can be measured by the tester can be switched instantaneously. Thereby, the measuring efficiency can be improved significantly.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-116336, filed on Apr. 18, 2002 including specification, claims, drawings and summary, on which the Convention priority of the present application is based, are incorporated herein by reference in its entirety.

What is claimed is:

1. A test board for testing semiconductor devices by connecting a plurality of semiconductor devices under the test with a semiconductor test apparatus, and sending test signals from said semiconductor test apparatus to said plurality of semiconductor devices under the test, said test board comprising:

a first wiring board disposed on said semiconductor test apparatus, and connected to said semiconductor test apparatus;

a second wiring board connected to each of said plurality of semiconductor devices under the test through contact portions; and a third wiring board disposed between said first wiring board and said second wiring board, wherein
said first wiring board and said third wiring board, and said second wiring board and said third wiring board are each connected by connectors,
said plurality of semiconductor devices under the test are disposed on a lead frame.
said test board is connected to said plurality of semiconductor devices under the test disposed on said lead frame, and
a plurality of said lead frames are connected in the long side direction, and said test signals are transmitted synchronizing the conveyance of said lead frames.

2. A test board for testing semiconductor devices by connecting a plurality of semiconductor devices under the test with a semiconductor test apparatus, and sending test signals from said semiconductor test apparatus to said plurality of semiconductor devices under the test, said test board comprising:

a first wiring board disposed on said semiconductor test apparatus, and connected to said semiconductor test apparatus;

a second wiring board connected to each of said plurality of semiconductor devices under the test through contact portions; and a third wiring board disposed between said first wiring board and said second wiring board, wherein
said first wiring board and said third wiring board, and said second wiring board and said third wiring board are each connected by connectors,
said plurality of semiconductor devices under the test are disposed on a lead frame,
said test board is connected in said plurality of semiconductor devices under the test disposed on said lead frame, and
said third wiring board comprises a plurality of circuits corresponding to different array patterns of said plurality of semiconductor devices under the test on said lead frames.

3. The test board for testing semiconductor devices according to claim 1, wherein said third wiring board comprises a plurality of circuits corresponding to different array patterns of said plurality of semiconductor devices under the test on said lead frames.

4. The test board for testing semiconductor devices according to claim 2, wherein said connectors are constituted so that said third wiring board is able to slide relative to said first and second wiring boards, and said connectors comprise a plurality of wiring patterns whose connecting states are switched corresponding to the slide position of said third wiring board; and the switching of said plurality of circuits is performed by switching the connecting states of said plurality of wiring patterns.

5. The test board for testing semiconductor devices according to claim 3, wherein said connectors are constituted so that said third wiring board is able to slide relative to said first and second wiring boards, and said connectors comprise a plurality of wiring patterns whose connecting states are switched corresponding to the slide position of said third wiring board; and the switching of said plurality of circuits is performed by switching the connecting states of said plurality of wiring patterns.

* * * * *